(12) United States Patent  (10) Patent No.: US 8,039,904 B2
Kakoschke et al.  (45) Date of Patent: Oct. 18, 2011

(54) APPARATUS OF MEMORY ARRAY USING FINFETS

(75) Inventors: Ronald Kakoschke, Munich (DE); Klaus Schruefer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/784,526

(22) Filed: May 21, 2010

(65) Prior Publication Data

US 2010/0252895 A1  Oct. 7, 2010

Related U.S. Application Data

(62) Division of application No. 11/734,069, filed on Apr. 11, 2007, now Pat. No. 7,723,786.

(51) Int. Cl.
*H01L 21/021* (2006.01)

(52) U.S. Cl. .......... 257/397; 257/401; 257/344
(58) Field of Classification Search .......... 257/397, 257/401, 344, E27.084
See application file for complete search history.

(56) References Cited

U.S. PATENT DOCUMENTS 7,723,786 B2 * 5/2010 Kakoschke et al. .......... 257/347
2005/0199920 A1  9/2005 Lee et al.

FOREIGN PATENT DOCUMENTS

DE  102006023730 A1  12/2006
* cited by examiner

*Primary Examiner* — Howard Weiss
*Assistant Examiner* — Steven Rao
(74) *Attorney, Agent, or Firm* — Philip H. Schlazer

(57) ABSTRACT

A memory cell includes a FinFET select device and a memory element. In some embodiments a memory cell has a contact element coupled between a surface of the fin and the memory element.

15 Claims, 3 Drawing Sheets

APPARATUS OF MEMORY ARRAY USING FINFETS

RELATED APPLICATION INFORMATION

The present application is a divisional application of U.S. patent application Ser. No. 11/734,069, filed on Apr. 11, 2007. U.S. patent application Ser. No. 11/734,069 is hereby incorporated by reference herein.

TECHNICAL FIELD

The various embodiments described herein relate generally to apparatus having memory cell arrays, and more particularly, to apparatus having memory cell arrays using FinFETs as select devices.

BACKGROUND

In recent years, with the increasing demand of high density of arrays of non-volatile memory (NVM) cells, e.g., phase change random access memories (PCRAM) and magnetic random access memories (MRAM), there is a significant need to reduce the size of the select devices of the NVM cells. Additionally, the increasing demand of high density of logic circuitries also causes the need to reduce the size of the switching devices of the logic circuitries.

DETAILED DESCRIPTION

In the following description, for purposes of explanation, numerous specific details are set forth in order to provide a thorough understanding of example embodiments. It will be evident, however, to one skilled in the art that the embodiments of the invention may be practiced without these specific details.

The term "FinFET" used in the following description denotes a type of multi-gate field effect transistor, i.e. MuGFET having a fin of material that functions as a channel for the transistor. The term "NVM" denotes a non-volatile memory. The term "PCRAM" denotes "a phase change random access memory". The term "MRAM" denotes "a magnetic random access memory". The term "CBRAM" denotes "a conductive bridging random access memory. The term "FeRAM" denotes "ferroelectric random access memory".

Figure 1:
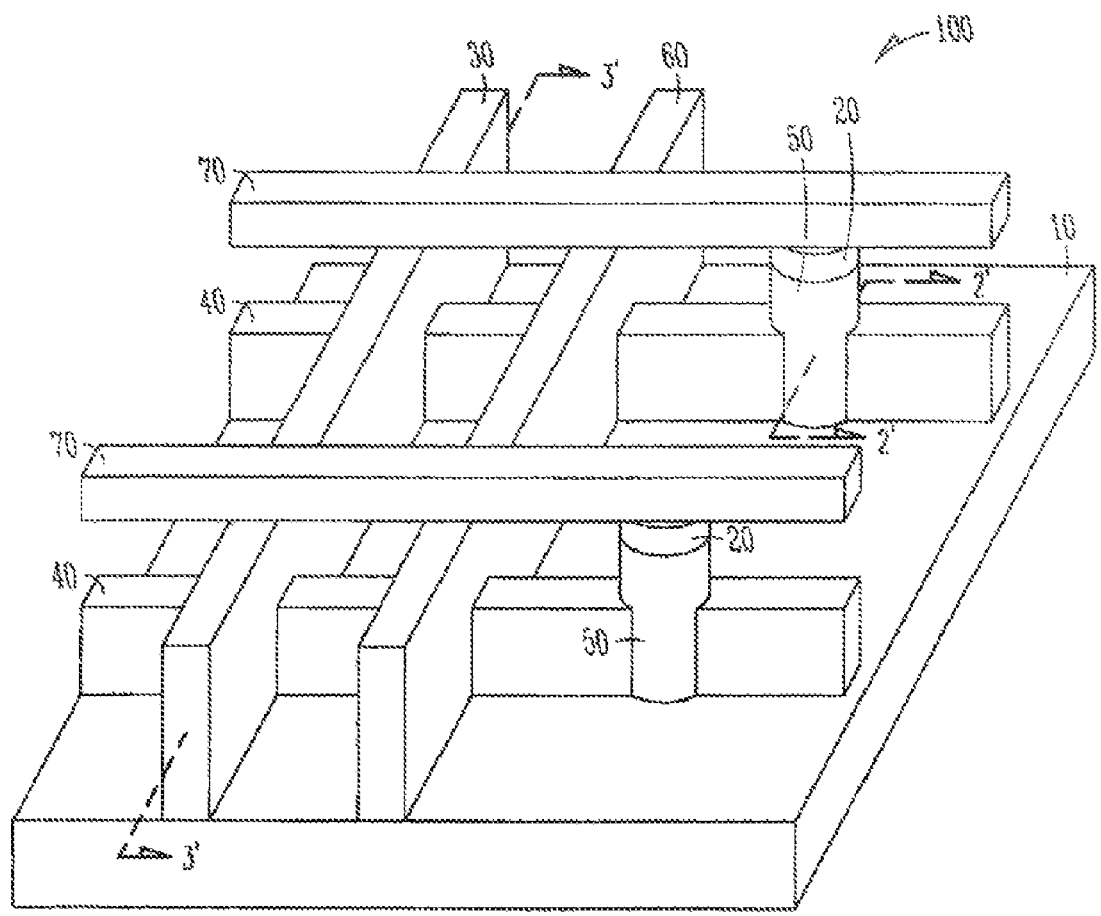
FIG. 1 is a perspective view of a unit of a memory cell array having a FinFET with a pair of bit line contacts, in accordance with an embodiment of the application.
Figure 1:
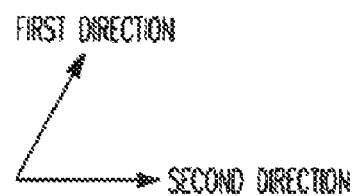

FIG. 1 is a perspective view of a portion of a memory cell array showing two cells, each with a FinFET select device and having bit line contacts in accordance with an embodiment of the application.

In the embodiment, memory cell array 100 utilizes FinFET select devices. A portion of the memory cell array 100 includes: a memory element 20 having two terminals, a fin 40 that is supported on an insulating surface of a substrate 10, and a contact element (bit line contact) 50 couple between the memory element 20 a surface of the fin 40. The contact element 50 is coupled to one terminal of the memory element 20, and at least partially wraps around and contacts the surface of fin 40. In some embodiments, the wrapped contact contacts one or both sidewalls of fin 40. In some embodiments the wrapped contact is in contact with one or more sidewalls and the top surface of fin 40. In some embodiments, the wrapped contact contacts only the top surface of fin 40.

In some embodiments, the memory element 20 is a non-volatile memory (NVM). In one embodiment, the memory element 20 is a phase change random access memory (PCRAM). In some embodiments, the phase change random access memory (PCRAM) comprises a chalcogenide memory material. In another embodiment, the memory element 20 is a magnetic random access memory (MRAM). In another embodiment, the memory element 20 is a conductive bridging random access memory (CBRAM). In another embodiment, the memory element 20 is a ferroelectric random access memory (FeRAM). In some embodiments, the resistance of the memory element 20 is programmed to be in either in a high resistance state or a low resistance state. The memory element state may be detected via the bit line.

In some embodiments, the substrate 10 is made of silicon. In other embodiments, the substrate 10 can be made of other semiconductor materials, such as germanium, and gallium arsenide. In an embodiment, the substrate 10 may include an insulating layer, such as a BOX (Buried Oxide) structure. In further embodiments, the substrate 10 may include an SOI (Silicon On Insulator) structure. Further insulating layers may be used in further embodiments, such as nitride, silicon nitride, or nitride with a double layer of oxide for example.

In some embodiments, the fin 40 is made of n or p-doped silicon. In other embodiments, the fin 40 can be made of other semiconductor materials, one or more of which is selected from a group of semiconductor materials consisting of germanium, silicon carbide, gallium arsenide, and indium phosphide. The fin 40 may be coated with a thin conductive film 41 of silicide (referring to FIGS. 2 and 3), for example, with a thickness of about 10 nm.

In some embodiments, the contact element 50 is made of tungsten. In other embodiments, the contact element 50 is made of a conductor selected from a group consisting of one or more of tungsten, copper, silver, gold, aluminum, and their alloys. The contact element 50 can be produced by using conventional etching process, for example, etching an opening (or a hole) to the top and at least partially down one or both sides of the fin 40 to the insulating layer of the substrate. This hole or opening is then filled with tungsten (or other conductive material), thus forming the contact element 50, which at least partially wraps around the fin 40. The contact element in one embodiment need not be centered on the fin, but should contact at least a portion of the top of the fin 40 and at least partially down one side of the fin 40. Better contact may be obtained by contacting both sides of the fin 40 down to the insulating layer of the substrate. In some embodiments, before filling the opening, a thin film of TiN is applied to the opening as a protective layer. In other embodiments, a thin film of TaN is applied to the opening as a protective layer.

In some embodiments, the fin 40 has a cross-section taken along its length which is substantially in the shape of a rectangle. In other embodiments, the cross-section of fin 40 is substantially in the shape of a rectangle with rounded corners. In one embodiment, the cross-section of fin 40 is substantially in the shape of omega $\Omega$. In an embodiment, the height to width ratio of the fin 40 is in the range of about 1:1 to 5:1. In an embodiment, the width of the fin is approximately 20 nm. The height and width may be significantly varied, as may be the ratio to obtain transistors with different desired characteristics. A larger height may provide a transistor capable of driving more current without requiring additional chip real estate.

Referring further to FIG. 1, in accordance with one embodiment, an apparatus is provided, which includes a plurality of memory cells adjacent to each other and arranged above a surface of a substrate 10 in a two dimensional array extending in an x-direction and in a y-direction along x and y axes. One unit 100 of the memory cells of the embodiment extending over the substrate 10 includes a pair of memory elements 20, a source line 30 positioned above, and in contact with, a source region of a fin 40. FIG. 1 also shows a pair of fins 40 extending from their source region coupled to source line 30 to a drain region at the other end of each fin, a pair of contact elements (i.e., bit line contacts) 50, a gate line 60, and a pair of bit lines 70. Each memory element 20 has two terminals, i.e., a top terminal and a bottom terminal.

In one embodiment, the source line 30 extends in the y-direction supported by the insulating surface of the substrate 10. The pair of fins 40 extend generally or substantially parallel in the x-direction above the surface of the substrate 10, and are wrapped around by the source line 30 on three sides. The contact elements 50 are arranged to at least partially wrap around a respective fin 40, and to support and electrically contact the bottom terminals of a memory element 20 respectively. The gate line 60 extends generally in the y-direction supported by the insulating layer of the substrate 10. The gate lines 60 wrap around respective fins 40 on three sides thereof, and are positioned between a source line 30 and a contact element 50. The pair of bit lines 70 extend generally in the x-direction above, but not in contact with, the source line 30 and the gate line 60, and are respectively coupled to the top terminal of respective memory elements 20.

In some embodiments, the substrate 10, the source line 30, the pair of contact elements 50, the gate line 60, and the pair of fins 40 form a finFET, i.e., a dual-fin MuGFET, which can be used as a select device of the memory elements 20. Such a finFET can also be used as a switching device in a logic circuit.

In some embodiments, the source line 30 is made of one or more metals selected from the group of metals consisting of tungsten, copper, silver, gold, and aluminum. Other suitable metal or other material conductors may also be used.

In some embodiments, the gate line 60 is made of polysilicon.

In some embodiments, the bit lines 70 are made of one or an alloy of metals selected from the group of metals consisting of tungsten, copper, silver, gold, and aluminum or others.

In some embodiments, the height to width ratio of each fin 40 is in a range of about 1:1 to about 5:1. In an embodiment, the width of each fin 40 is in a range from about 10 nm to about 25 nm.

In some embodiments, the minimum cell size of each memory cell in a multi-cell array may be reduced. In some embodiments, the memory cells in the multi-cell array are constructed in accordance with an architecture of no more than 32 nm. In some embodiments, the fin pitch, i.e., the y-axis spacing between adjacent fins, is about 100 nm. For such embodiments, the bit line contact y-axis pitch is also 100 nm and the diameter of the bit line contacts is about 40 nm. In such an embodiment, the gate, i.e. the word line, has a width of about 30 nm and is spaced about 40 nm from the bit line contact in one x-axis longitudinal direction along the fin axis and about 40 nm from the source line contact in the other longitudinal direction along the fin axis. The common source line, which may be shared with an adjacent cell, has a width of about 20 nm, about 10 nm of which is assigned to each cell. In such an embodiment, the total x-axis dimension of a single cell, along the longitudinal axis of the fin is about 180 nm. The cell x-axis dimension is the sum of 10 nm for the assigned portion of the common source line width, plus 30 nm for the width of the gate or word line and 80 nm for each of the 40 nm separations between the gate line and the source line and bit line contacts respectively, plus about 40 nm for the diameter of the bit line contact and an additional 20 nm which is one-half of the spacing between adjacent bit line contacts along the longitudinal axis of the fins. The area for a cell embodiment with the above nominal dimensions is thus about 0.018 $\mu m^2$, which is the product of the x-axis dimension of about 180 nm and the y-axis dimension, or fin pitch, of about 100 nm.

It will be realized that the embodiment discussed above is but one embodiment of the invention and that other embodiments may have different x-axis and y-axis dimensions and even may have some difference in the minimum cell area and that the dimensions discussed are used for explanation rather than limitation. In some embodiments, the area of the memory cell is less than about 0.022 $\mu m^2$. In some embodiments, the area of the memory cell is less than 0.020 $um^2$.

In cells where a conventional source line construction is used, the source line is at least about 40 nm wide, about 20 nm of which are attributable to each cell. In such conventional constructions, separate landing areas are required on the substrate to connect an end of the fins to the base of the bit line contacts. In those conventional constructions, a minimum pitch distance of about 140 nm is determined by the sum of the length of the landing area in the y-axis direction, perpendicular to the longitudinal axis of the fins, is about 90 nm plus an additional 50 nm to allow spacing between adjacent contact landing pads along the y-axis. In the x-axis, the cell dimension of such conventional constructions is at least about 190 nm which is the sum of the width of the bit line contacts in the x-axis of at least about 40 nm, the width of the gate or word line of 30 nm plus the two 40 nm separations of the gate from the common source line and from the landing area, 20 nm as one-half of the source line width of about 40 nm and about 20 nm which is one-half of the separation of the bit line contacts between adjacent cells. With nominal minimum x and y axis dimensions of 190 nm by 140 nm, the minimum dimension of a conventional cell is thus at least about 0.027 $\mu m^2$.

The minimum cell size of multi-cell embodiments with a reduced width common source line and bit line contacts wrapped around a portion of the fins (0.018 $\mu m^2$) is about one-third less than comparable cells with conventional source lines and bit line contacts with separate landing areas (0.027 $\mu m^2$).

An alternative measure of the area reduction achieved using certain embodiments of the invention is by viewing the nominal cell areas calculated above as multiples of $A^2$, where A is about one-half of the fin pitch of the architecture upon which they are based. In some embodiments, a multiplier of 10.8 is used for the 0.027 $\mu m^2$ area conventional cell discussed above for a 50 nm metal half pitch feature size. In the embodiment of the invention discussed above, a multiplier of 7.2 is used for the 0.018 $\mu m^2$ area of a metal half pitch embodiment discussed. In some embodiments, the cell size is less than 9 $A^2$, where A is one-half the fin pitch of the memory cell. In some embodiments, the cell size is less than 8 $A^2$ A still further alternative measure of the area reduction achieved using certain embodiments of the invention is by viewing the nominal cell areas calculated above as multiples of $B^2$, the square of the defining feature size of the architecture upon which they are based. In some embodiments, a multiplier of 26.4 is used for the 0.027 µm$^2$ area conventional cell discussed above for a nominal 32 nm feature size, based upon the printed gate length, i.e. its actual width along the longitudinal axis of the fin transistor fin. In the embodiment of the invention discussed above, a multiplier of 17.6 is used for the 0.018 µm$^2$ area 32 nm architecture embodiment discussed above. In some other embodiments, the cell size of said memory cell is less than 22 B$^2$, where B is the printed gate length of the finFET. In some embodiments the cell size is less than 20 B$^2$. In some embodiments, the cell size is less than 18 B$^2$.

Figure 2:
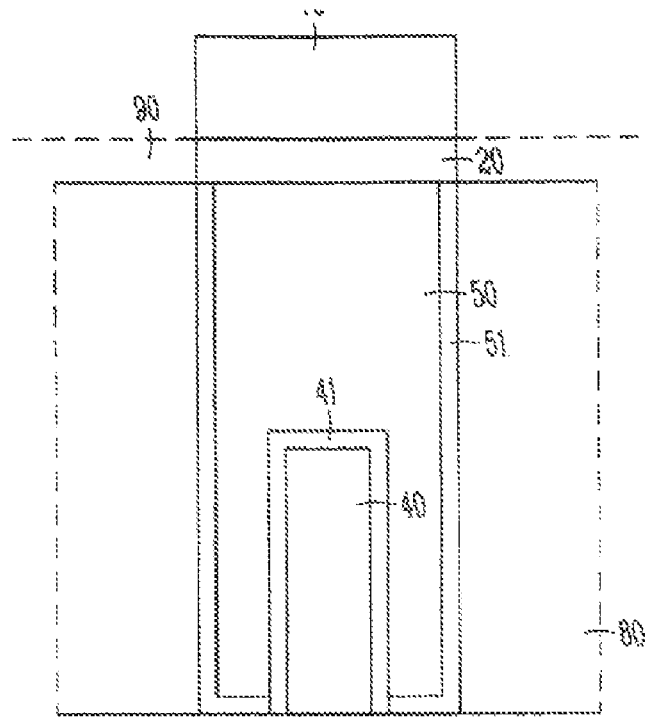
FIG. 2 is a cross-section view of the unit of the memory cell array shown in FIG. 1 through one of the bit line contacts of the FinFET, in accordance with an embodiment of the application.

FIG. 2 is a cross-section view of the unit of the memory cell array shown in FIG. 1 through one of the bit line contacts of the FinFET along section lines 2'-2'.

In some embodiments, a layer of BPSG (borophosphosilicate glass) 80, as a layer of insulator, is formed to fill the space between the source line 30, the pair of fins 40, the contact elements 50, and the gate line 60. In some embodiments, the height of the layer of BPSG 80 is at least as high as the highest one of the source line 30, the gate line 60, and the pair of elements 50.

In some embodiments, a layer of silicon dioxide SiO$_2$, 90 is formed to fill the space above the top surface of the layer of BPSG 80, between the source line 30, the gate line 60, bit lines 70, and the memory elements 20.

In some embodiments, each fin 40 is coated with a thin conductive film 41. In an embodiment, the thin film 41 is a thin conductive film of silicide.

In some embodiments, as shown in FIG. 2, each contact element 50 has a protective layer 51 covering each contact element 50. In an embodiment, the layer 51 is TiN.

Figure 3:
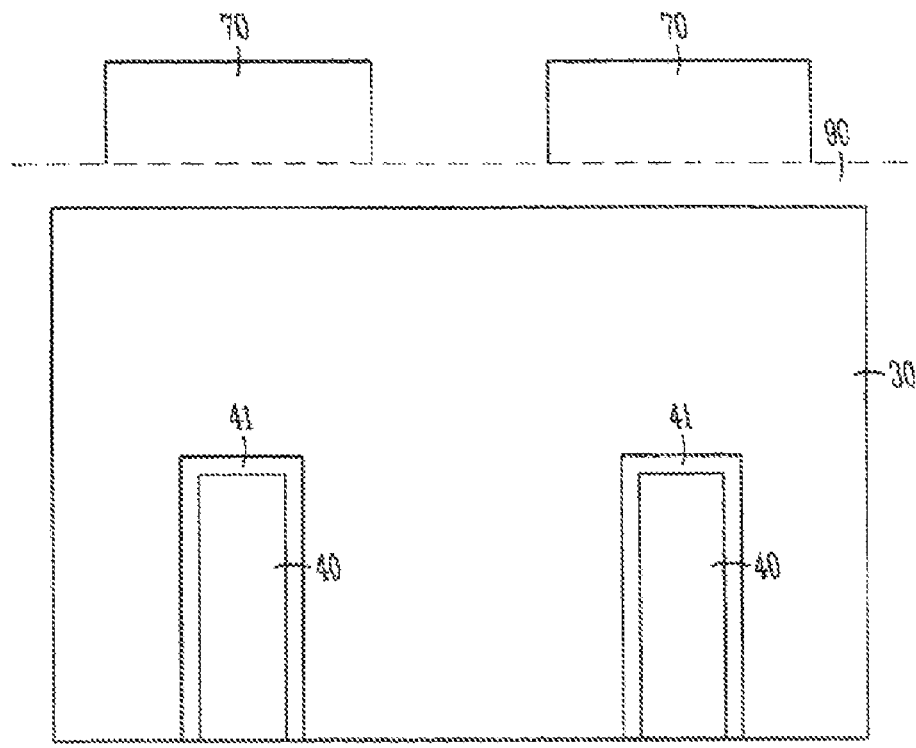
FIG. 3 is a cross-section view of the unit of the memory cell array shown in FIG. 1 along a source line of the FinFET, in accordance with an embodiment of the application.

FIG. 3 is a cross-section view of the unit of the memory cell array shown in FIG. 1 along a source line 30 of the FinFET, taken along section lines 3'-3'.

In some embodiments, a layer of silicon oxide (SiO2) 90 is formed to fill the space above the top surface of the layer of borophosphosilicate glass (BPSG) 80, between the source line 30, the gate line 60, bit lines 70, and the memory elements 100.

In some embodiments, each fin 40 is coated with a thin film 41. In an embodiment, the thin film 41 is a thin conductive film of silicide.

Figure 4:
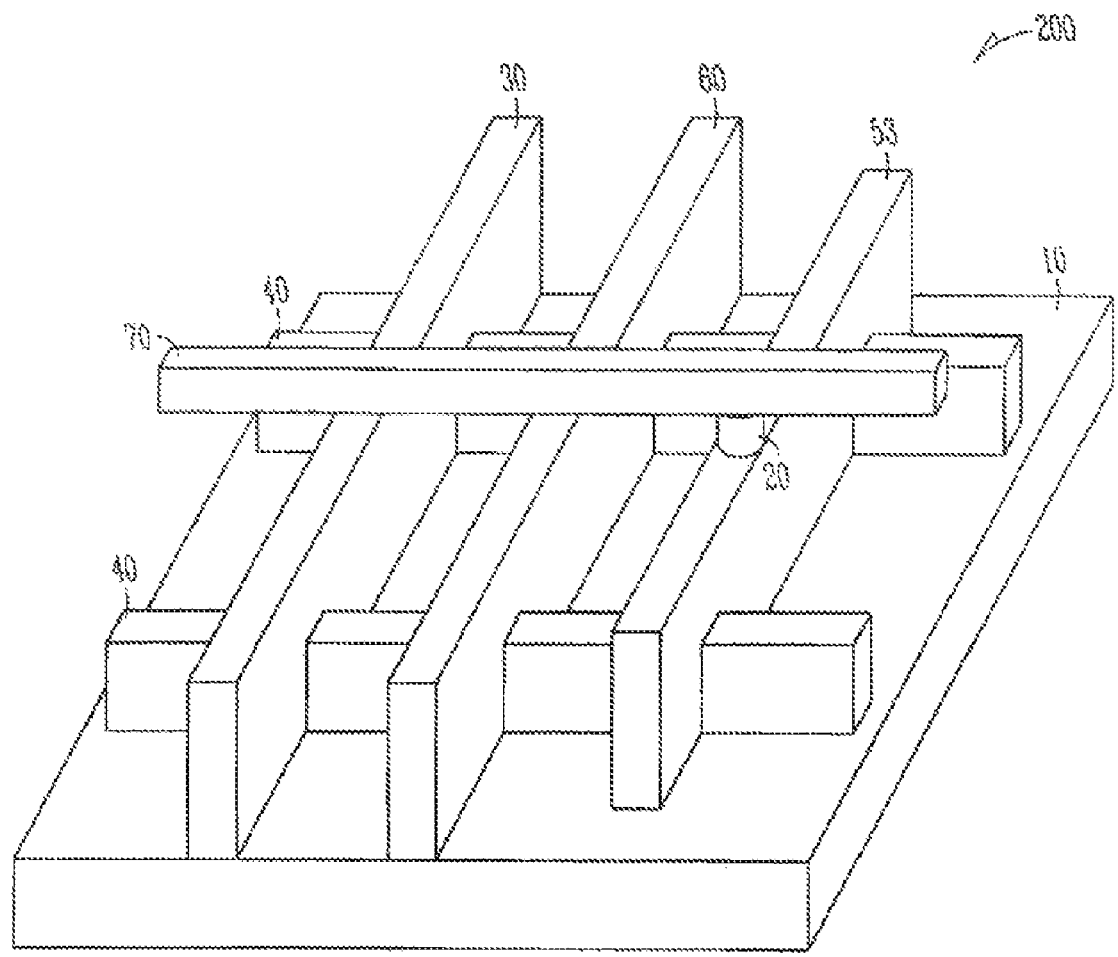
FIG. 4 is a perspective view of one unit of a memory cell array having a FinFET with a local interconnect, in accordance with another embodiment of the application.

FIG. 4 is a perspective view of one unit of a memory cell array having a FinFET with a local interconnect, in accordance with another embodiment of the application. In accordance with the embodiment, an apparatus is provided, which includes a plurality of memory cells adjacent to each other and arranged above a surface of a substrate 10 in a two dimensional array extending generally in an x-direction and a y-direction. One unit 200 of the memory cells of the embodiment extending over the substrate 10 includes a memory element 20, a source line 30, a pair of fins 40, a local interconnect 53, a gate line 60, a bit line 70. The memory element 20 has two terminals, i.e., a top terminal and a bottom terminal.

In the embodiment of FIG. 4, the source line 30 extends generally in the y-direction supported by an insulating layer on the surface of the substrate 10. The pair of fins 40 extend generally in the x-direction supported by an insulating layer on the surface of the substrate 10, and the source line 30 wraps around them on three sides. The local interconnect 53 is formed supported by an insulating layer on the surface of the substrate 10, wraps around the pair of fins 40, and supports and contacts the bottom terminal of the memory element 20. In one embodiment, the memory element 20 is positioned on the interconnect 53 between the fins, but the location on the interconnect 53 may be varied along the interconnect 53 as desired. Locating it between the fins may provide for more efficient utilization of chip real estate.

The gate line 60 extends generally in the y-direction above the surface of the substrate 10, wraps around the pair of fins 40 on three sides thereof, and is positioned between the source line 30 and the local interconnect 53. The bit line 70 extends generally in the x-direction above, but not in contact with, the source line 30 and the gate line 60, and is coupled to the top terminal of the memory element 20.

In the embodiment, the substrate 10, the source line 30, the local interconnect 53, the gate line 60, and the pair of fins 40 form a finFET (a dual-fin MuGFET), which can be used as a select device of the memory element 20. Such a finFET can also be used as a switching device in a logic circuit. A dual-fin MuGFET may be used to drive larger currents.

In some embodiments, the source line 30 is made of one or more metals selected from the group consisting of tungsten, copper, silver, gold, aluminum, and their alloys.

In some embodiments, the gate line 60 is made of polysilicon.

In some embodiments, the bit lines 70 is made of a metal, which can be made of one or more conductors selected from the group consisting of tungsten, copper, silver, gold and aluminum, and their alloys.

In accordance with the embodiments, the length of the fin and the bit line, and the length of the source line and the gate line may be reduced as a result of the use of wrap around contacts in place of separately formed contact pads. FinFET select devices, and the apparatus having memory cell arrays that have integrated or embedded FinFETs as select devices in accordance with the embodiments of the application may reduce area requirements.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. Apparatus, comprising:
   a pair of memory elements;

a pair of contact elements, each of the contact elements coupled to one memory element of the pair of memory elements;

a pair of fins, laterally extending in parallel above the surface of a substrate, each fin of the pair of fins partially wrapped by a common source line, and each fin of the pair of fins partially wrapped by one contact element of the pair of contact elements;

a common gate line partially wrapping each of the pair of fins between a source region and a drain region of each of the fins; and a pair of bit lines extending laterally in parallel to the fins, above, but not in contact with the gate line, each of the bit lines coupled to one memory element of the pair of memory elements.

2. The apparatus of claim 1, wherein the area of each unit of the memory cell array is a function of a pitch of the pair of fins, a width of the source line, and a width of each contact element of the pair of contact elements.

3. The apparatus of claim 1, wherein the pitch of the pair of fins is substantially 100 nm.

4. The apparatus of claim 1 wherein the width of the source line is substantially 20 nm.

5. The apparatus of claim 1, wherein the width of each contact element of the pair of contact elements is substantially 40 nm.

6. The apparatus of claim 1, wherein each memory element of the pair of memory elements is a NVM.

7. The apparatus of claim 1, wherein each contact element of the pair of contact elements is made of material selected from one or more of tungsten, copper, silver, gold, aluminum, and their alloys.

8. The apparatus of claim 1, wherein the source line is made of material selected from one or more of tungsten, copper, silver, gold, and aluminum.

9. The apparatus of claim 1, wherein each bit line of the pair of bit lines is made of material selected from one or more of tungsten, copper, silver, gold, and aluminum.

10. The apparatus of claim 1, wherein the gate line is made of poly silicon.

11. The apparatus of claim 1, wherein the space between the source line, the fin lines, the contact elements, and the gate line is filled with BPSG (borophosphosilicate glass).

12. The apparatus of claim 1, wherein the space between the source line, the gate line, the bit lines, and the memory elements is filled with $SiO_2$ (silicon oxide).

13. The apparatus of claim 1, wherein the source region of each fin of the pair of fins is partially wrapped by the common source line.

14. The apparatus of claim 1, wherein the drain region of each fin of the pair of fins is partially wrapped by the one contact element of the pair of contact elements.

15. The apparatus of claim 1, wherein each of the contact elements are vertically oriented.

* * * * *